(12) United States Patent
Gaul

(10) Patent No.: US 10,224,351 B2
(45) Date of Patent: Mar. 5, 2019

(54) SWITCHABLE SOLAR CELL DEVICES

(71) Applicant: INTERSIL AMERICAS LLC, Milpitas, CA (US)

(72) Inventor: Stephen Joseph Gaul, Melbourne Village, FL (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 136 days.

(21) Appl. No.: 14/826,744

(22) Filed: Aug. 14, 2015

(65) Prior Publication Data

US 2015/0357971 A1    Dec. 10, 2015

Related U.S. Application Data

(62) Division of application No. 14/023,079, filed on Sep. 10, 2013, now Pat. No. 9,147,774, which is a division
(Continued)

(51) Int. Cl.
*H01L 31/02* (2006.01)
*H02S 50/10* (2014.01)
(Continued)

(52) U.S. Cl.
CPC ...... *H01L 27/1421* (2013.01); *H01L 29/7804* (2013.01); *H01L 31/02* (2013.01); *H01L 31/02008* (2013.01); *H01L 31/02021* (2013.01); *H01L 31/0504* (2013.01); *H01L 31/112* (2013.01); *H01L 31/18* (2013.01); *H02S 10/00* (2013.01); *H02S 40/34* (2014.12);
(Continued)

(58) Field of Classification Search
CPC ............... H01L 31/02021; H01L 29/78; H01L 27/1421; H02S 40/34
USPC .................................................. 136/243–265
See application file for complete search history.

(56) References Cited

U.S. PATENT DOCUMENTS 3,663,308 A   5/1972  Davey
4,175,249 A   11/1979 Gruber
(Continued)

OTHER PUBLICATIONS

U.S. Patent and Trademark Office, "Final Office Action", "from U.S. Appl. No. 12/470,325", dated Jun. 22, 2012, pp. 1-19.
(Continued)

*Primary Examiner* — Niki Bakhtiari
(74) *Attorney, Agent, or Firm* — Foley & Lardner LLP

(57) ABSTRACT

Exemplary embodiments provide a solar cell device, and method for forming the solar cell device by integrating a switch component into a solar cell element. The solar cell element can include a solar cell, a solar cell array and/or a solar cell panel. The integrated solar cell element can be used for a solar sensor, while the solar sensor can also use discrete switches for each solar cell area of the sensor. Exemplary embodiments also provide a connection system for the solar cell elements and a method for super-connecting the solar cell elements to provide a desired connection path or a desired power output through switch settings. The disclosed connection systems and methods can allow for by-passing underperforming solar cell elements from a plurality of solar cell elements. In embodiments, the solar cell element can be extended to include a battery or a capacitor.

8 Claims, 11 Drawing Sheets

Related U.S. Application Data of application No. 12/470,325, filed on May 21, 2009, now Pat. No. 8,558,103.

(60) Provisional application No. 61/147,888, filed on Jan. 28, 2009.

(51) Int. Cl.

| | | |
|---|---|---|
| *H01L 29/78* | (2006.01) | |
| *H01L 31/112* | (2006.01) | |
| *H01L 27/142* | (2014.01) | |
| *H02S 50/00* | (2014.01) | |
| *H01L 31/18* | (2006.01) | |
| *H01L 31/05* | (2014.01) | |
| *H02S 40/34* | (2014.01) | |
| *H02S 10/00* | (2014.01) | |
| *H02S 40/36* | (2014.01) | |

(52) U.S. Cl.
CPC ............. *H02S 40/36* (2014.12); *H02S 50/00* (2013.01); *H02S 50/10* (2014.12); *Y02E 10/50* (2013.01)

(56) References Cited

U.S. PATENT DOCUMENTS

| | | | |
|---|---|---|---|
| 4,295,058 A | 10/1981 | Lade et al. | |
| 4,390,790 A | 6/1983 | Rodriquez | |
| 4,533,783 A * | 8/1985 | Benjamin | H01L 31/06 136/249 |
| 4,688,071 A * | 8/1987 | Tihanyi | H01L 27/1443 257/290 |
| 5,549,762 A | 8/1996 | Cantarini | |
| RE35,836 E | 7/1998 | Rodriguez | |
| 5,910,738 A | 6/1999 | Shinohe et al. | |
| 6,184,513 B1 | 2/2001 | Sawada | |
| 6,303,943 B1 | 10/2001 | Yu et al. | |
| 6,350,944 B1 * | 2/2002 | Sherif | H01L 31/042 136/244 |
| 6,430,692 B1 | 8/2002 | Kimble et al. | |
| 2005/0133081 A1 | 6/2005 | Amato et al. | |
| 2008/0198523 A1 * | 8/2008 | Schmidt | H01L 31/02021 361/88 |
| 2009/0283128 A1 | 11/2009 | Zhang et al. | |
| 2010/0186795 A1 | 7/2010 | Gaul | |
| 2010/0191383 A1 | 7/2010 | Gaul | |

OTHER PUBLICATIONS

U.S. Patent and Trademark Office, "Notice of Allowance", "from U.S. Appl. No. 12/470,325", dated Jul. 3, 2013, pp. 1-16.

U.S. Patent and Trademark Office, "Office Action", "from U.S. Appl. No. 12/470,325", dated Dec. 22, 2011, pp. 1-18.

U.S. Patent and Trademark Office, "Office Action", "from U.S. Appl. No. 12/470,325", dated Feb. 14, 2013, pp. 1-22.

U.S. Patent and Trademark Office, "Restriction Requirement", "from U.S. Appl. No. 12/470,325", dated Sep. 28, 2011, pp. 1-9.

U.S. Patent and Trademark Office, "Notice of Allowance", "from U.S. Appl. No. 14/023,079", dated Jun. 23, 2015, pp. 1-7, Published in: US.

U.S. Patent and Trademark Office, "Office Action", "from U.S. Appl. No. 14/023,079", dated Sep. 2, 2014, pp. 1-27, Published in: US.

U.S. Patent and Trademark Office, "Office Action", "from U.S. Appl. No. 14/023,079", dated Mar. 25, 2015, pp. 1-13, Published in: US.

U.S. Patent and Trademark Office, "Restriction Requirement", "from U.S. Appl. No. 14/023,079", dated Jun. 18, 2014, pp. 1-6, Published in: US.

U.S. Patent and Trademark Office, "Final Office Action", "from U.S. Appl. No. 12/470,351", dated Jul. 19, 2012, pp. 1-15.

U.S. Patent and Trademark Office, "Office Action", "from U.S. Appl. No. 12/470,351", dated Mar. 29, 2012, pp. 1-15.

U.S. Patent and Trademark Office, "Restriction Requirement", "from U.S. Appl. No. 12/470,351", dated Jan. 23, 2012, pp. 1-6.

U.S. Patent and Trademark Office, "Final Office Action", "from U.S. Appl. No. 12/684,512", dated Jul. 19, 2012, pp. 1-10.

U.S. Patent and Trademark Office, "Office Action", "from U.S. Appl. No. 12/684,512", dated Apr. 12, 2012, pp. 1-14.

U.S. Patent and Trademark Office, "Restriction Requirement", "from U.S. Appl. No. 12/684,512", dated Mar. 16, 2012, pp. 1-7.

Nguyen et al., "A Reconfigurable Solar Photovoltaic Array Under Shadow Conditions", Oct. 11, 2008, pp. 980-986, Publisher: IEEE.

Perlaky et al., "Sensor Powering with Integrated MOS Compatible Solar Cell Array", Oct. 14, 2006, pp. 1-3, Publisher: IEEE.

\* cited by examiner

SWITCHABLE SOLAR CELL DEVICES

CROSS-REFERENCE TO RELATED APPLICATIONS

This application is a divisional of U.S. application Ser. No. 14/023,079, titled "SWITCHABLE SOLAR CELL DEVICES" and filed on Sep. 10, 2013, which is a divisional of U.S. application Ser. No. 12/470,325, titled "SWITCHABLE SOLAR CELL DEVICES" and filed on May 21, 2009, which claims the benefit of and priority to U.S. Provisional Application No. 61/147,888, titled "SOLAR CELL WITH INTEGRATED SWITCH AND CONNECTION METHOD", and filed on Jan. 28, 2009, the disclosures of which are incorporated herein by reference.

FIELD OF THE INVENTION

This invention relates generally to solar cells and, more particularly, to devices and connection systems of solar cells, and methods for forming and arranging solar cells.

BACKGROUND OF THE INVENTION

Solar energy is a potentially large alternative energy source. The most common form of solar cells is based on the photovoltaic (PV) effect in which light falling on a two-layer semiconductor device produces a photovoltage or potential difference between the layers. Typically, such cells are connected together in series in order to provide large working voltages. For example, an average panel usually includes 10 to 36 full-sized solar cells connected in series, producing 6-20V and 10-100 watts.

There are certain shortcomings, however, produced by the series configured solar cell panel. For example, the solar panel is very sensitive to the output of individual cells. Particularly, in the case of a failure of any single solar cell in the series, the entire row of solar cells is lost due to this undesirable single-point failure. In addition, whenever sunlight is not cast evenly upon the solar cell panel, such as when part of the solar cell panel is in the shade or a shadow, the solar cells receiving more light will produce a greater current than the solar cells receiving less light. In that case, the current output by each row of the cells will be limited to the lowest current produced by any one solar cell in the row. This, in turn, causes a drop in output power for the solar cell panel. Further, such issues may become more important, as solar technology moves from commercial settings into residential settings. This is because residential settings for solar cells will have limited sighting (or location) options and will potentially suffer from poorer maintenance than in a commercial setting.

Conventional methods to solve these failures include use of by-pass diodes. In this case, failed cells may be bypassed as the voltage drop across the cells increases, but this is not a good solution when there is more than one solar cell having lower output in the series of solar cells.

Thus, there is a need to overcome these and other problems of the prior art and to provide devices, and connection systems of solar cells and methods for forming and arranging solar cells.

SUMMARY OF THE INVENTION

According to various embodiments, the present teachings include a device that includes a solar cell element. The solar cell element can include two solar cell terminals having a switch component integrated with at least one of them. Such switch component can be used to control the solar cell element and can include, for example, one or more MOS-based switches within the solar cell element. In various embodiments, the device that includes switchable solar cell element can be used for solar sensors.

According to various embodiments, the present teachings also include a method for forming a solar device. The solar device can be formed from a semiconductor solar cell element that includes a p contact diffusion region and an n contact diffusion region in a semiconductor substrate. A MOS-based structure can then be formed and integrated with at least one of the n and p contact diffusion regions in the semiconductor substrate. In this manner, the MOS-based structure can be a switch to control the semiconductor solar cell element.

According to various embodiments, the present teachings also include a solar sensor. The disclosed solar sensor can include a plurality of solar cell areas with each solar cell area having a solar pixel based on a diffusion length of a minority current carrier. The disclosed solar sensor can also include a plurality of switches with each switch independently addressing one solar area. Electric output from each solar cell area that is controlled by a corresponding independent switch can be read out and/or displayed.

According to various embodiments, the present teachings further include a sensing method using a solar sensor. In this method, a plurality of solar cell areas with each solar cell area having a solar pixel can be formed. The solar pixel can be determined by a diffusion length of a minority current carrier. A plurality of switches can then be formed with each switch independently controlling one of the plurality of solar cell areas. Electric output of the controlled solar cell area can then be monitored and/or displayed.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

Figure 1A:
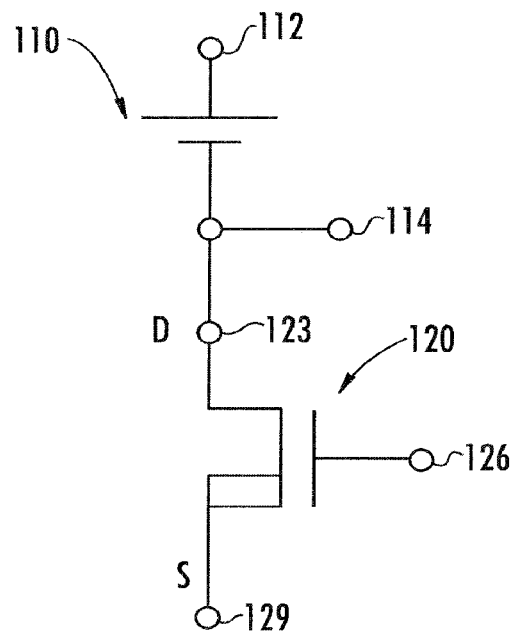
FIG. 1A depicts an exemplary integrated solar cell device in accordance with the present teachings.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Exemplary embodiments provide a solar cell device, and method for forming the solar cell device by integrating a switch component into a solar cell element. Exemplary embodiments also provide a solar sensor and methods for forming and using the solar sensor to detect a defected or a shaded solar cell area. Exemplary embodiments also provide a connection system of the solar cell elements and method for super-connecting solar cell elements so as to provide a desired connection path or a desired power output. Exemplary embodiments further provide a system and a method for by-passing underperforming solar cells of a solar cell component.

As used herein, the term "solar cell element" can include a single solar cell, a solar cell array such as a group or a series of solar cells, or a solar cell panel (or solar cell module) such as a group of solar cell arrays. The solar cell element can have at least two solar cell terminals. In various embodiments, the disclosed "solar cell element" as well as the related devices, systems and methods can further be extended to include, for example, a battery or a capacitor.

The switch component can include one or more switches that are either integrated into the solar cell terminal itself or added separately from the solar cell as discrete elements. In various embodiments, switches that are integrated into either or both of the solar cell terminals can include MOS-based structures including, but not limited to, VDMOS (vertically diffused metal oxide semiconductor) or LDMOS (laterally diffused metal oxide semiconductor) transistors that can utilize the corresponding solar cell terminal as, for example, the drain of the DMOS-based structure. Such DMOS elements can include both N-type and P-type DMOS (NDMOS and/or PDMOS) depending on the polarity of the solar cell terminal. In various embodiments for integrated switches, a DMOS configuration can be preferred as it allows for a low on-state resistance (Rdson) without reducing the output of the solar cell element. While a bipolar transistor switch, including both vertical and lateral PNP and NPN transistors, can also be integrated into one or both terminals of the solar cell element, these are not preferred for the integration due to their high voltage drop even when operated in their saturation regions.

For embodiments that include discrete switches that are not integrated into the solar cell terminals, there are a variety of switches that can be used including, but not limited to, any MOS (metal oxide semiconductor) transistor including PMOS, NMOS, LDMOS, and VDMOS; any bipolar transistor including NPN, PNP or IGBJT (insulated gate bipolar transistor); any FET (field effect transistor) including PFET or NFET; or any mechanically operated switches including configurations that use conventional mechanically actuated or electrically actuated (such as relays) switches in SPST (single pole single throw), SPDT (single pole double throw), as well as SPMT (single pole multiple throw) configurations for integrations that connect to a single or both terminals of the solar cell element, or switches in DPST (double pole single throw), DPDT (double pole double throw), as well as DPMT (double pole multiple throw) configurations that connect to both terminals of the solar cell element.

In various embodiments, the MOS-based switches can be integrated with one or both terminals of the solar cell element. The integrated solar cell terminal(s) can be combined with one of a source region and a drain region of the MOS-based switch component to have a common contact for the disclosed solar cell device. In some embodiments, the integrated or combined solar cell terminal can still keep its contact, which is also referred to herein as an "external contact", in order to provide more connection flexibilities.

As disclosed herein, the term "external contact" refers to an electrical contact to the solar cell terminal, for example, to bypass a switch component so as to allow a separate electrical connection to the affected terminal of the solar cell element.

In various embodiments, when a plurality of MOS-based switches are used for the switch component, the MOS-based switches can be formed to have a common drain region or a common source region according to the integration design of the solar cell device.

Figure 1B:
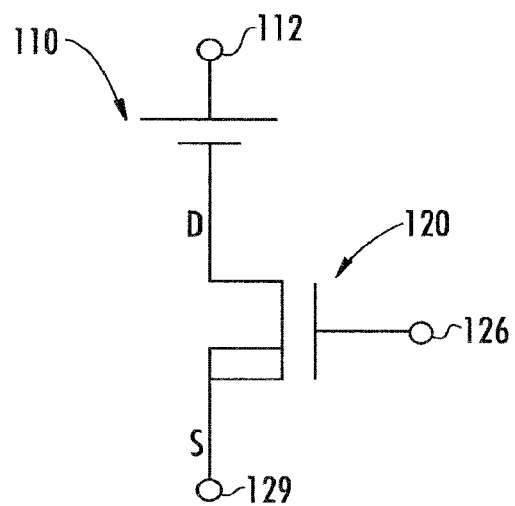
FIG. 1B depicts a second exemplary integrated solar cell device in accordance with the present teachings.
Figure 1C:
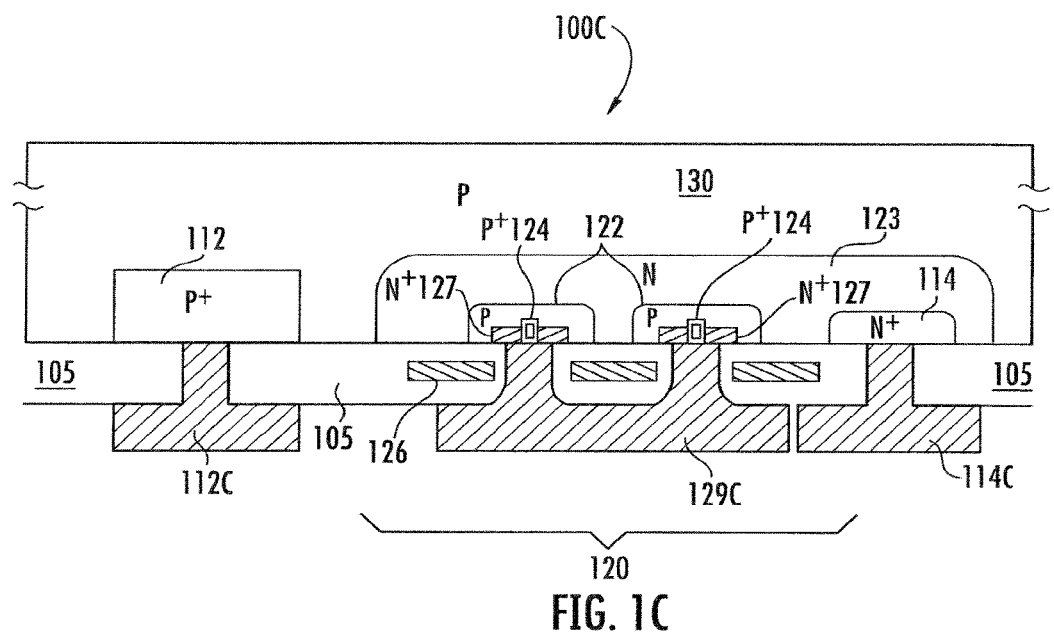
FIG. 1C depicts a cross section of the exemplary solar cell devices of FIGS. 1A-1B in accordance with the present teachings.

FIGS. 1A-1C depict an exemplary solar cell device having a MOS-based switch component integrated within a single solar cell in accordance with the present teachings. Specifically, FIG. 1C depicts schematic cross section of an exemplary solar cell device 100C according to FIGS. 1A-1B in accordance with the present teachings.

It should be readily apparent to one of ordinary skill in the art that the devices depicted in FIGS. 1A-1C represent generalized schematic illustrations and that other components can be added or existing components can be removed or modified. In addition, although a single solar cell is depicted for the solar cell element in FIGS. 1A-1C, one of ordinary skill in the art would understand that other solar cell elements including, but not limited to, a solar cell array, or a solar cell panel, can be used for the disclosed solar cell device. Further, any solar cell elements that are compatible with the materials and fabrication of MOS technologies can be used for the disclosed solar cell device 110 in FIGS. 1A-1C.

It is also possible that the solar cell element 110 in FIGS. 1A-1B can represent a conventional battery or even a high value capacitor. Such configurations can allow for cell balancing applications in battery packs, for example, or other sources of power that include multiple connected batteries or capacitors.

For simplicity, FIGS. 1A-1C show an exemplary integration of one MOS-based structure 120 with an exemplary single solar cell 110. As shown, the solar cell 110 can have two terminals or two contact diffusion regions 112 and 114. The MOS-based structure 120 can have, for example, a drain region 123, a source region 129 and a gate 126.

The MOS-based structure 120 can be used as a switch using the gate 126 to control, e.g., to turn on and off, the solar cell 110, so as to control power output, e.g., current and/or voltage, of the solar cell 110. In an exemplary embodiment, the MOS-based structure 120, such as a VDMOS, can only need a breakdown voltage of a few volts and can be designated with a low on-state resistance (Rdson).

In the illustrated examples, the MOS-based structure 120 can be integrated with the exemplary terminal 114 of the solar cell 110. For example, the drain region 123 of the MOS-based structure 120 can be integrated or combined with the terminal 114 of the solar cell 110. The integrated solar cell terminal 114 may keep its own external contact (see 114c) as shown in FIGS. 1A and 1C, or alternatively, the external contact 114c may be removed using the common contact with the drain region 123 of the MOS-based structure 120, as shown in FIG. 1B.

As shown in FIG. 1C, an exemplary DMOS switch 120 can be integrated into one of the terminals of a conventional solar cell, i.e., the n terminal 114, in order to switch the solar cell on and off. One example of the conventional solar cells can include silicon-based photovoltaic cells having a solar cell array or a solar cell panel including alternating p and n contact diffusions. In the illustrated embodiment of FIG. 1C, the n terminal of the solar cell can be integrated by the exemplary DMOS-based structure, although one of ordinary skill in the art would understand that any other MOS-based switches can be used for the disclosed solar cell device.

The device 100C can thus include a solar cell p terminal 112, a solar cell n terminal 114, and a DMOS-based structure 120 formed in a semiconductor substrate 130.

The DMOS-based structure 120 can be, for example, a vertical DMOS-based structure that includes source regions (n+) 127 in p-body regions 125,122, p-body contact regions 124 (e.g., a heavily doped region p+), a drain region 123, a gate 126, and insulative regions 105 as known by one of ordinary skill in the art.

The integrated solar cell n terminal 114, e.g., the heavily doped (n+) region 114, can also be used as a drain region contact of the DMOS-based structure 120. The p-body 122 and 125 can be formed on top of the drain region 123, which can be a deep n well formed by implantation and/or diffusion process in a p-type layer in a typical silicon substrate (also see 130), for example. The source region 127 and p-body region 122 can be shorted together by the combination of a p-body contact region 124 and the p-body-source contact metallization 129c.

In various embodiments, the electrical contacts, such as, for example, the solar cell p-contact 112c, the solar cell n-contact 114c, and the contacts 129c, 114c and 126 for the source region, the drain region and the gate, can include the use of copper interconnect and other metals that are compatible with solar cell and semiconductor processing. In various embodiments, the gate material can further include, e.g., polysilicon that is ion implanted or in-situ doped to be N+ or P+ in polarity.

In some embodiments, the solar cell n terminal contact 114c can be used as an external contact for the solar cell device 110C (also see FIG. 1A). In other embodiments, the cell n terminal contact 114c can be removed (not shown) from FIG. 1C, as also indicated in FIG. 1B.

In various embodiments, the conductivity of semiconductor regions, i.e., the use of p and n type semiconductor regions, can be reversed for the solar cell devices 100C along with any other devices disclosed herein.

Figure 2:
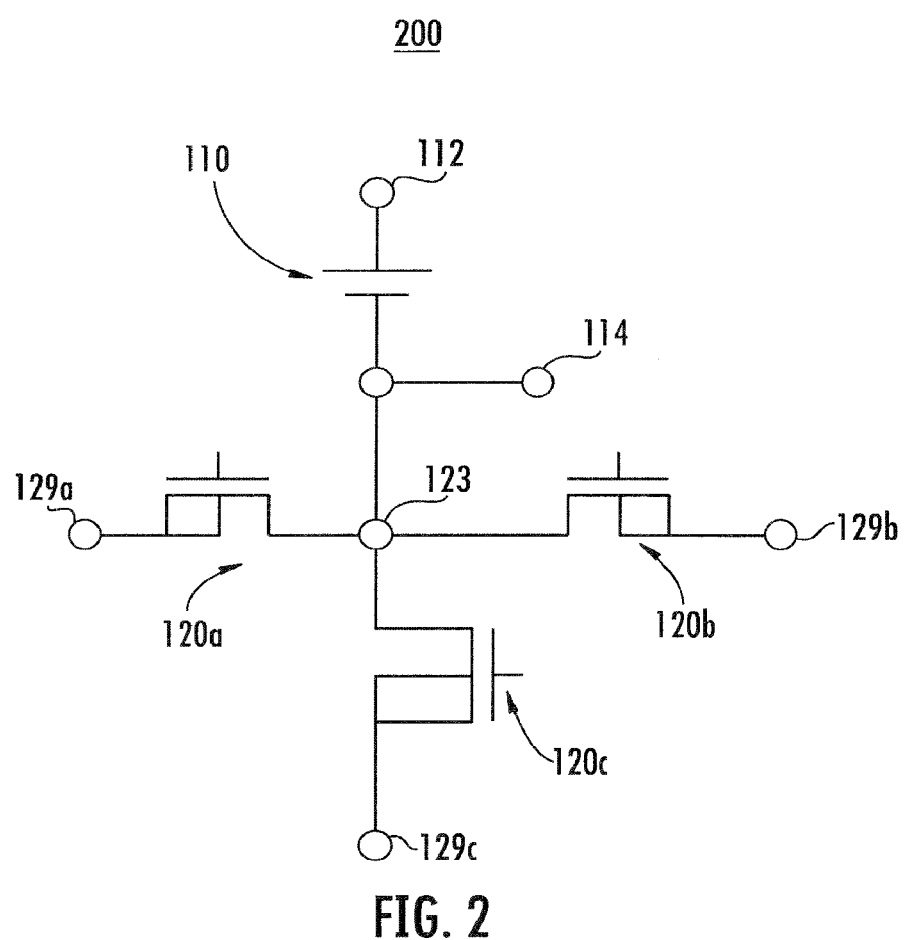
FIG. 2 depicts an additional exemplary solar cell device in accordance with the present teachings.

In various embodiments, a plurality of switches can be included for the switch component in the disclosed solar cell device. For example, FIG. 2 depicts another exemplary solar cell device in accordance with the present teachings. It should be readily apparent to one of ordinary skill in the art that the device 200 depicted in FIG. 2 represents a generalized schematic illustration and that other components/devices can be added or existing components/devices can be removed or modified.

As shown in FIG. 2, the exemplary solar cell device 200 can include a solar cell 110 having two terminals (or contact diffusions) 112 and 114. The device 200 can also include a number of MOS-based switches 120a-c integrated with one of the solar cell terminals, e.g., the terminal 114. In various embodiments, as similarly described in FIGS. 1A-1C, the terminal 114 may or may not exist but sharing a common contact with the drain region 123 of the MOS-based switch component 120.

In the specific embodiment of FIG. 2, while three MOS-based structures 120 are integrated with the solar cell 110 sharing a common drain region 123 for the solar cell device 200, one of ordinary skill in the art will understand that any number of switch structures can be integrated within the solar cell. In addition, the formation structure of the device 200 can be similar to that shown in FIG. 1C, except that more switches (e.g., two more as for the device 200) can be formed in series within the solar cell device sharing a common drain region. In various embodiments, the multiplicity of switches for the disclosed solar cell device can provide a variety of connection flexibilities with any other components that are related to the solar cell.

Various embodiments can thus include a method for forming a solar cell device. For example, a semiconductor solar cell element that includes a p contact diffusion region and an n contact diffusion region can first be provided or formed in a semiconductor substrate. A MOS-based structure can then be integrated with at least one of the n contact diffusion region and the p contact diffusion region in the semiconductor substrate so as to control the semiconductor solar cell element as a switch. In various embodiments, a plurality of MOS-based structures can be formed in the semiconductor substrate having a common drain region or a common source region.

In various embodiments, the integrated plurality of MOS-based structures can have a breakdown voltage consistent with the number of solar cells in the stack. For example, a single solar cell switch can operate with a breakdown voltage of about 1 or 2 volts, while solar cell stacks can require a breakdown voltage of about 10 volts.

Figure 3:
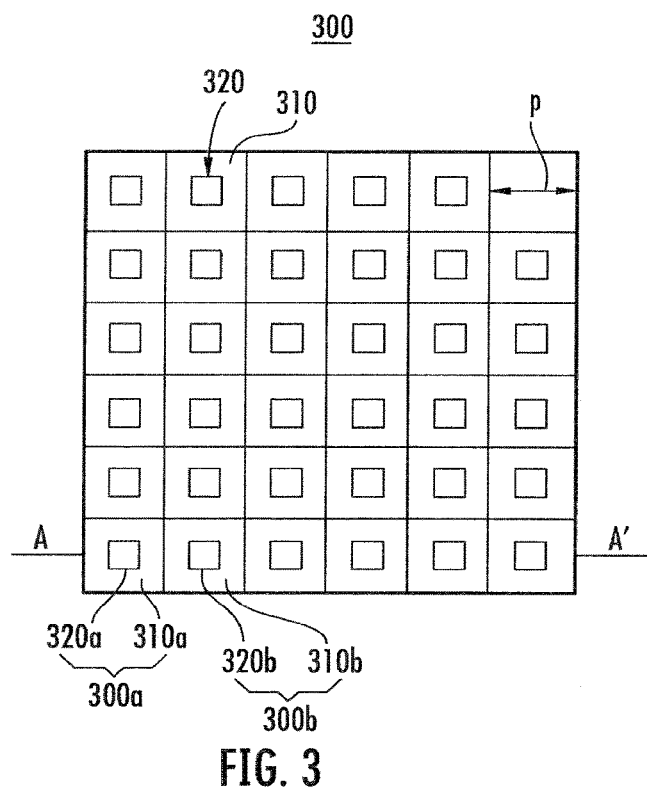
FIG. 3 depicts an exemplary solar sensor in accordance with the present teachings.

Various embodiments can also include a solar sensor and its formation in accordance with the present teachings. For example, FIG. 3 depicts a portion of an exemplary solar sensor component 300 in accordance with various embodiments of the present teachings. It should be readily apparent to one of ordinary skill in the art that the sensor 300 depicted in FIG. 3 represents a generalized schematic illustration and that other components/devices can be added or existing components/devices can be removed or modified.

As shown, the solar sensor component 300 can include a plurality of solar cell areas 310, and a plurality of switch components 320. The solar sensor component 300 can include various sensor elements with each sensor elements (e.g., 300a or 300b) including one solar cell area (e.g., 310a or 310b) and one switch component (e.g., 320a or 320b) associated therewith.

Each solar cell area 310 can be defined by, e.g., a single pixel in the array having a pixel size P and divided from the solar sensor component 300. The pixel size P can depend on a diffusion length of holes and/or electrons drifting in the semiconductor. For example, in silicon photovoltaic cells, when solar radiation falls on a silicon n-p junction, photons with wavelength less than 1.13 µm can generate electron-hole pairs. The electric field in the depletion layer can drive the electrons to the n-type side and the holes to the p-type side. This can separate most of the electrons and holes before they can recombine. The "diffusion length" can be determined by how far the minority current carriers, electrons or holes, can drift or diffuse in the area before their recombination or before reaching the junction. Each solar cell area 310 can therefore include at least one single solar pixel.

Each switch component 320 can independently address the associated solar cell area 310. In various embodiments, each switch component 320 can be integrated within one of the solar cell areas 310 or can be discrete from the corresponding solar cell area 310.

Note that, although the solar sensor component shown in FIG. 3 includes 36 solar sensor elements or solar sensor areas in a 6×6 array, one of ordinary skill in the art would understand that any other numbers of solar sensor elements or any other suitable arrangements/arrays of the solar sensor elements/areas can be used for the disclosed solar sensor component 300.

Figure 4:
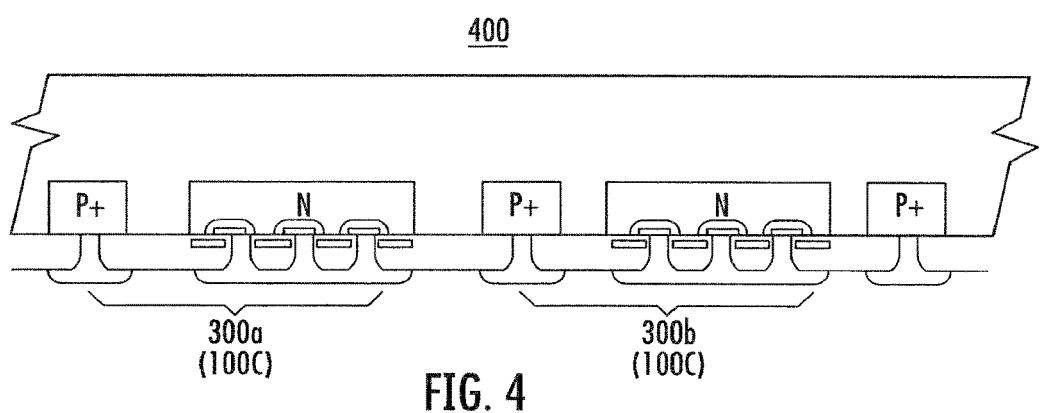
FIG. 4 depicts a cross-section of an exemplary solar sensor portion in the direction A-A' of the device shown in FIG. 3 using the exemplary integrations of FIGS. 1A-1C in accordance with the present teachings.

FIG. 4 depicts a cross-section portion of an exemplary solar sensor 400 using the integration shown in FIG. 1C in accordance with the present teachings. The cross-section of FIG. 4 shows a solar sensor portion in the direction of A-A' of FIG. 3, wherein the portion can include sensor elements 300a-b.

In various embodiments, the integration of FIG. 1 can be used as an example for each sensor element. As shown, the device 100C shown in FIG. 1C can be used as an element 300a or 300b for the solar sensor 400, wherein each switch component independently control the associated or corresponding solar cell.

In various embodiments, the solar sensor 300 and/or 400 can further include a readout component used to display an electric output from each individual solar cell area controlled by the corresponding independent switch component. Typically, for a solar cell, an electrical load resistance R can be connected across the semiconductor junction. The electrons and holes can produce a current, and the energy in the solar radiation can then be converted into electrical energy in the circuit.

When one solar cell area of the solar cell sensor has defects, impurities or is shaded, the diffusion length and the life time of the current carriers, i.e., the holes or the electrons, can be reduced. Electronic power output may not be measured for this individual solar cell area. Defects or shade can then be detected. In one embodiment, the solar sensor 300 or 400 can be used for sensing light dark areas. For example, shade or photon irradiation detection can be performed by locally collecting the electric outputs.

Various embodiments can further include a method for forming solar sensors, for example, using the method described in FIGS. 1A-1C and 2. In another example, the method can include first forming or providing a solar cell component having a plurality of solar cell areas. Each solar cell area can be defined by a pixel of a diffusion length of the electrons or holes. A plurality of switches can then be formed or provided with each switch independently controlling one solar cell area. In order to determine a defected solar cell area or a shaded area, the electric output of each solar cell area can be monitored.

In various embodiments, super connection schemes, systems and methods can be provided for solar cell based applications. The super connection can provide a variety of arrangements and connection paths for solar cell elements with a desired electric output.

Figure 5:
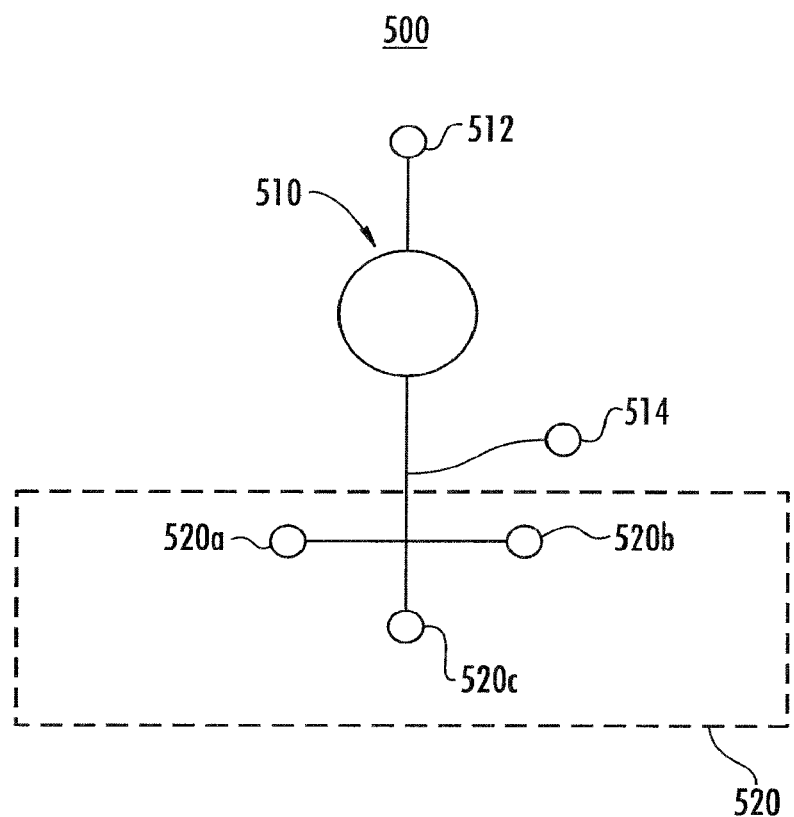
FIG. 5 represents an exemplary solar cell device in accordance with the present teachings.

For simplicity of illustration, FIG. 5 represents an exemplary symbol for the solar cell devices in accordance with the present teachings. As shown, the solar cell device 500 can include a solar cell element 510 having two terminals 512 and 514. The solar cell element 510 can be, e.g., a single solar cell as shown in FIGS. 1A-1C and FIG. 2; a group of solar cells, such as a solar cell array; and/or a solar cell panel, such as a group of solar cell arrays.

The solar cell device 500 can also include a switch component 520 having one or more switches 520a-c associated with one of the solar cell terminals, e.g., 514. In various embodiments, the switch component 520 can be an integrated switch component, e.g., formed within a solar cell element as shown in FIG. 1C and FIG. 4; or a discrete switch component from the solar cell element 510. Any suitable switch as disclosed herein or as known to one of ordinary skill in the art can be used for the discrete switch component.

Although three switches are depicted in FIG. 5 for the switch component 520, various embodiments can include a number of switches that is more than or less than three for the switch component 520.

FIGS. 6-8 provide various embodiments of connection systems and connection methods of solar cell elements. In various embodiments, the term "super connection" refers to a connection scheme that provides all possible cross connections between any adjacent solar cell elements. The super connection can be fulfilled by associating switch components with each solar cell element, wherein each switch component can further include various numbers of switches. Such super connection can provide flexibility to wire, e.g., an array or a panel of the solar cell elements, and therefore provide flexibility on power outputs. In an exemplary embodiment, a number of solar cell elements can be super connected in a manner of series-parallel management. That is, one or more series of solar cell elements can be super connected in parallel.

Figure 6A:
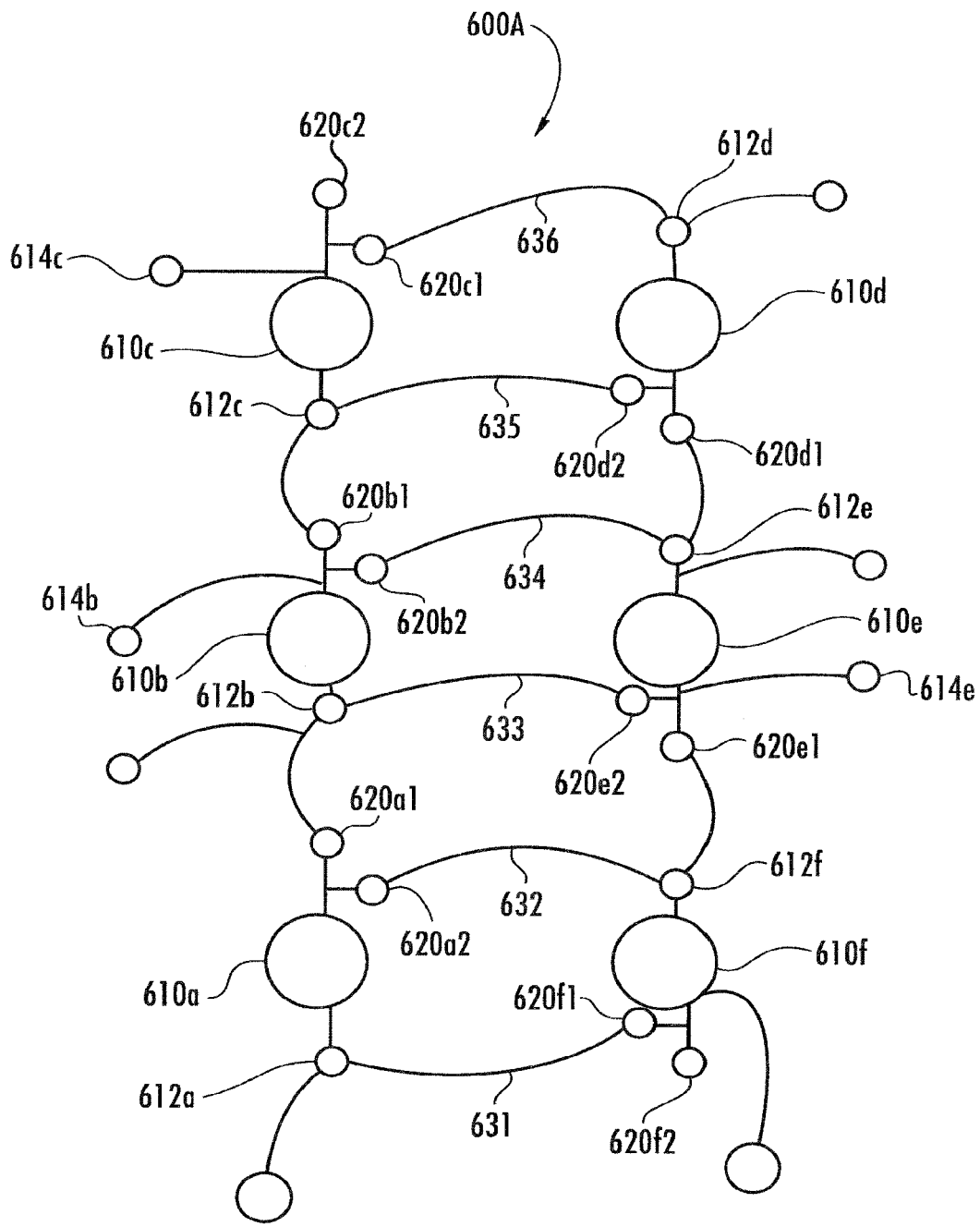
FIGS. 6A-6B depict exemplary super connection systems for solar cell elements in accordance with the present teachings.
Figure 6B:
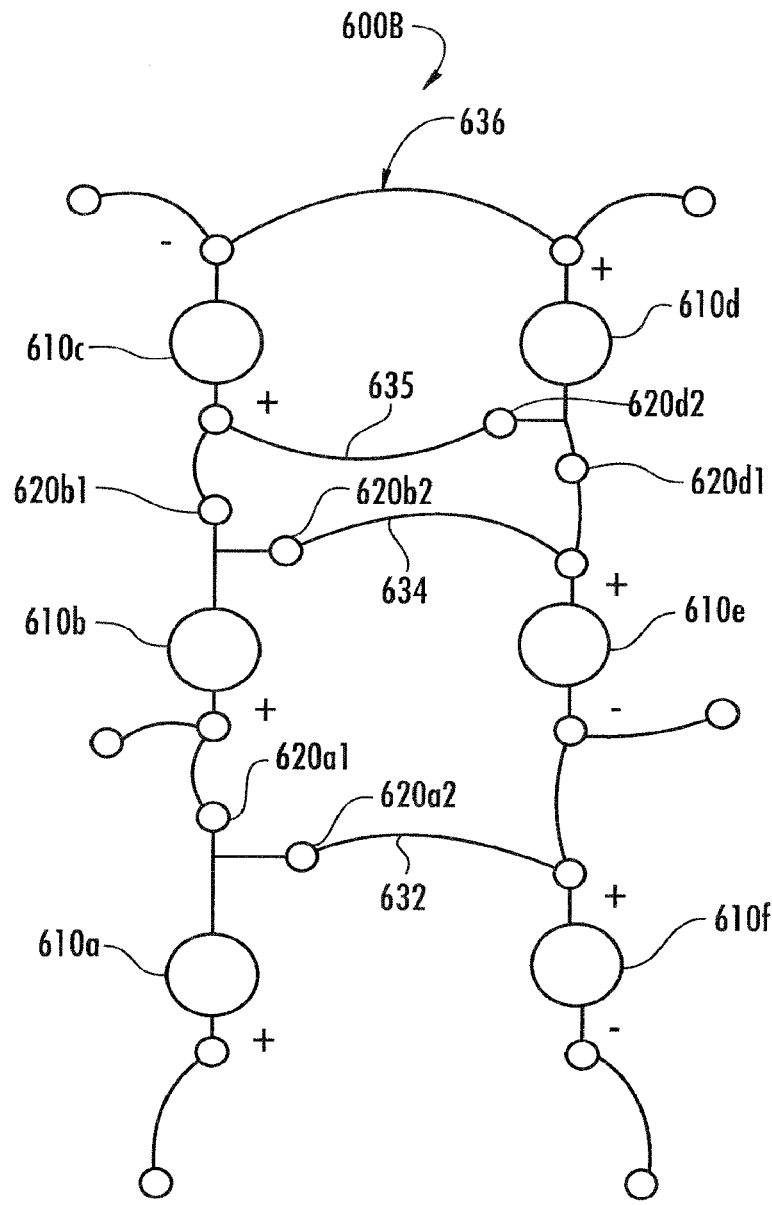

FIGS. 6A-6B depict exemplary super connection systems in accordance with the present teachings. It should be readily apparent to one of ordinary skill in the art that the systems depicted in FIGS. 6A-6B represent generalized schematic illustrations and that other components/devices can be added or existing components/devices can be removed or modified.

In various embodiments, elements, components and devices related to the solar cell device 500 shown in FIG. 5 can be used as examples for the super connections of solar cell elements.

In FIG. 6A, the connection system 600A can include a plurality of solar cell elements 610a-f with each solar cell element associated with one or more adjacent switches 620a-f from a plurality of switch components to form the super connection. In various embodiments, switches connected to a specific solar cell element can be from different switch components and each switch component can include at least one switch. Solar cell elements can therefore be super interconnected through a variety of connections using, e.g., the associated switches 620, and/or external contacts 612a-f or 614a-f. Having the super connected system, each of the associated switches can be set to support a desired connection arrangement of the plurality of solar cell elements for a controlled power output.

In FIG. 6A, for example, the solar cell element 610*b* can be super connected using an exemplary series-parallel connection scheme. As shown, the solar cell element 610*b* can be connected to a first adjacent solar cell element 610*a* through the external contact 612*b* and the switch 620*a*1; the solar cell element 610*b* can also be connected to a second adjacent solar cell element 610*c* through the switch 620*b*1 and an external contact 612*c*; the solar cell element 610*b* can further be connected to a third adjacent solar cell element 610*e* through the external contact 612*b* and the switch 620*e*2, and/or through the switch 620*b*2 and the external contact 612*e*; and, the solar cell element 610*b* can even further be connected to a forth or fifth adjacent solar cell element 610*d* or 610*f* through, for example, the crossing wire 634/635 or the cross wire 632/633 along with related switches.

In various embodiments, when more solar cell elements are needed to be connected with the exemplary solar cell element 610*b*, more switches 620*b*, more external contacts such as 614*b* and/or more crossing wires can be available as desired. Likewise, other solar cell elements, e.g., 610*a*, and 610*c*-*f*, in FIG. 6A can go through such super connection process.

In various embodiments, the super connection of FIG. 6A can be simplified or cleaned by removing one or more redundant switch component(s) or crossing wire(s) using some common nodes instead. For example, the switch components 620*c*, 620*e* and 620*f* as well as the crossing wires 631 and 633 can be "effectively removed" from the connection system 600A leaving a "simplified" super connection system 600B shown in FIG. 6B.

As used herein, the "effectively removed" switches and crossing wires may physically exist, i.e., not necessarily to be physically removed, but may be electrically switched off with no current flowing there-through. For example, switches can be "effectively removed" by an electrical by-passing, e.g., using external contacts; and crossing wires can be "effectively removed" by suitable switch settings with no current allowed to flow through.

As shown in FIG. 6B, the connection system 600B can include a plurality of solar cell elements 610*a*-*f* with at least one solar cell element associated with one or more adjacent switches 620*a*-*f* from a plurality of switch components to form the super connection.

In various embodiments, each switch that is associated with the solar cell elements can be set to support a desired connection arrangement of the plurality of solar cell elements for a controlled power output. That is, by controlling the switches, any desired configurations and outputs can be obtained.

Figure 7C:
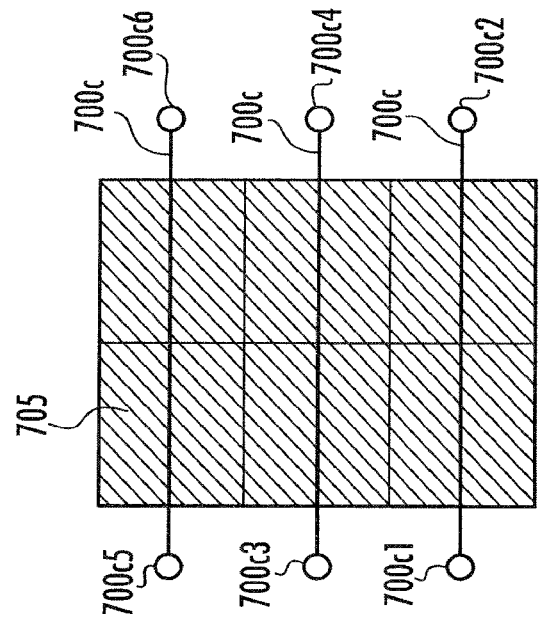
FIGS. 7A-7C depict various connection systems for an exemplary solar cell panel in accordance with the present teachings.
Figure 7B:
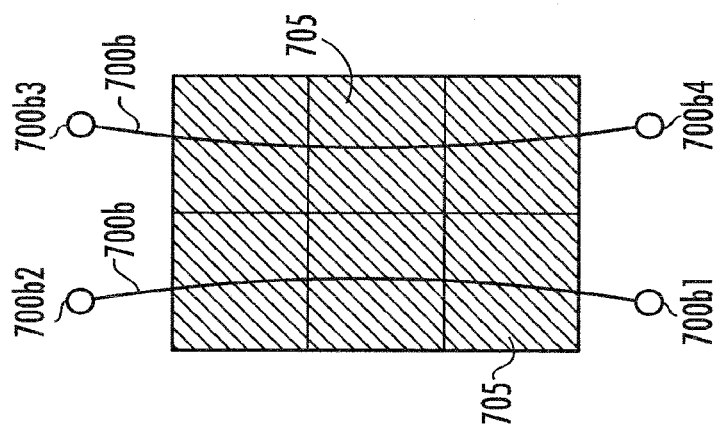
Figure 7A:
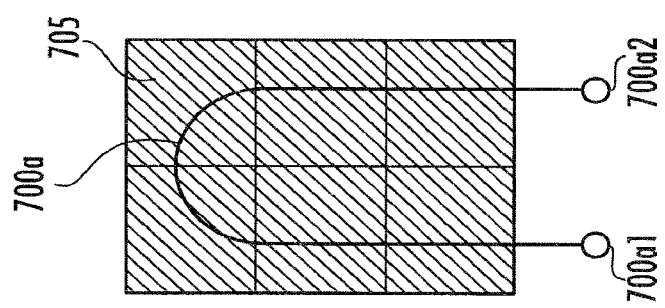

FIGS. 7A-7C depict various connection systems for an exemplary panel having 6 solar cell elements in accordance with the present teachings. As shown, the connection systems use a box 705 to show one solar cell device (e.g., the device 500 shown in FIG. 5) including a solar cell element and the associated switches. It should be readily apparent to one of ordinary skill in the art that the systems depicted in FIGS. 7A-7C represent generalized schematic illustrations and that other components/devices/boxes can be added or existing components/devices/boxes can be removed or modified.

In various embodiments, the connection systems shown in FIGS. 7A-7C can be obtained by first super connecting the exemplary 6 solar cell elements, for example, as shown in FIG. 6A or 6B, and then setting each switch associated with the solar cell elements to form various connection arrangements as needed.

In one embodiment when series-parallel management is used for the exemplary 6 solar cell panel, possible connection arrangements can include, for example, a 1×6 arrangement (see FIG. 7A), a 2×3 arrangement (see FIG. 7B), a 3×2 arrangement (see FIG. 7C), and/or a 6×1 arrangement (not shown). In this case, each switch component can have two switches for the solar cell panel that has 6 solar cell elements.

In FIG. 7A, the 1×6 connection arrangement can have 1 loop (see 700*a*) of 6 solar cell elements (see boxes 705) connected in series providing two connection contacts 700*a*1 and 700*a*2 for the panel.

In FIG. 7B, the 2×3 connection arrangement can have 2 parallel loops (see 700*b*) of 3 solar cell elements (see boxes 705) connected in series providing four connection contacts 700*b*1-700*b*4 for the panel.

In FIG. 7C, the 3×2 connection arrangement can have 3 parallel loops (see 700*c*) of 2 solar cell elements (see boxes 705) connected in series providing six connection contacts 700*c*1-700*c*6 for the panel.

Such connection arrangements 700*a*-*c* can be obtained from switching the super connected solar cell system as shown in FIG. 6A or 6B. For example, in order to have a connection arrangement of 1×6 of FIG. 7A, switches of the super connected system 600A (see FIG. 6A) including, for example, 620*a*1, 620*b*1, 620*c*1, 620*d*1, 620*e*1 can be turned on, while switches of 620*a*2, 620*b*2, 620*c*2, 620*d*2, 620*e*2, 620*f*1 and 620*f*2 can be turned off. In addition, crossing wires 631, 632, 633, 634 and 635 (see FIG. 6A) can be effectively removed because there is no current path due to the switch settings, while crossing wire 636 stay connected because corresponding switch settings allow current flow. Although the crossing wires 631, 632, 633, 634 and 635 are not illustrated in FIG. 7A, these "effectively removed" crossing wires may physically exist but be electrically switched off. Further, in various embodiments, some of the switches (e.g., switches 620*c*1 as well as the switch 620*c*2) can be bypassed by using external contacts (e.g., contact 614*c*) for this illustrated connection arrangement.

In various embodiments, the connection arrangement of FIG. 7A can be obtained by setting switches from the simplified super connection system of FIG. 6B.

Likewise, the connection systems shown in FIG. 7B and FIG. 7C can also be obtained by setting related switches from the super connection system of FIGS. 6A-6B, as similarly described for the arrangement process of FIG. 7A. In addition, some of the crossing wires may be "effectively removed" from the super connection system shown in FIGS. 6A-6B using switch settings, which are not necessarily physically removed. For example, for the connection system 700*b*, all the crossing wires 631-636 can be "effectively removed", while for the connection system 700*c*, crossing wires 631, 633, and 635 can be "effectively removed".

In this manner, by choosing suitable switches or by re-switching suitable switches of the disclosed super connection system, the connections of the solar cell elements can be rearranged. In various embodiments, the solar cell panel can have various number of solar cell elements connected as desired from a related super connection system using the exemplary systems and methods shown in FIGS. 6-7.

For example, the solar cell panel can also have 12 solar cell elements that need to be connected. For a desired electric output and thus a desired solar cell connection, the 12 solar cell elements can be super connected with each solar cell element interconnected with all adjacent solar cell elements by switches, external contacts and/or crossing wires using similar methods described in FIGS. 6-7.

As a result, various configurations can be obtained for the 12 solar cell elements including: (1) a 1×12 connection arrangement having 1 loop of 12 solar cell elements connected in series providing two connection contacts for the panel; (2) a 2×6 connection arrangement having 2 parallel loops of 6 solar cell elements connected in series providing four connection contacts for the panel; (3) a 3×4 connection arrangement having 3 parallel loops of 4 solar cell elements connected in series providing four connection contacts for the panel; (4) a 4×3 connection arrangement having 4 parallel loops of 3 solar cell elements connected in series providing eight connection contacts for the panel; (5) a 6×2 connection arrangement having 6 parallel loops of 2 solar cell elements connected in series providing ten connection contacts or more for the panel; and/or (6) a 12×1 connection arrangement having 12 individual solar cell elements for the panel.

In various embodiments, the super connection system disclosed herein can be used to bypass one or more underperforming solar cell elements (e.g., that are at least partially shaded, or defective) from groups of solar cell elements. Thus, if a single solar cell element fails, there can be alternate paths by which the output power of all other solar cell elements/devices can contribute to the total output power of the solar cell array or panel. In various embodiments, after by-passing the underperforming solar cell elements, e.g., using switches, all of the other remaining solar cell elements can be arranged or re-arranged according to the disclosed super connection process.

Figure 8A:
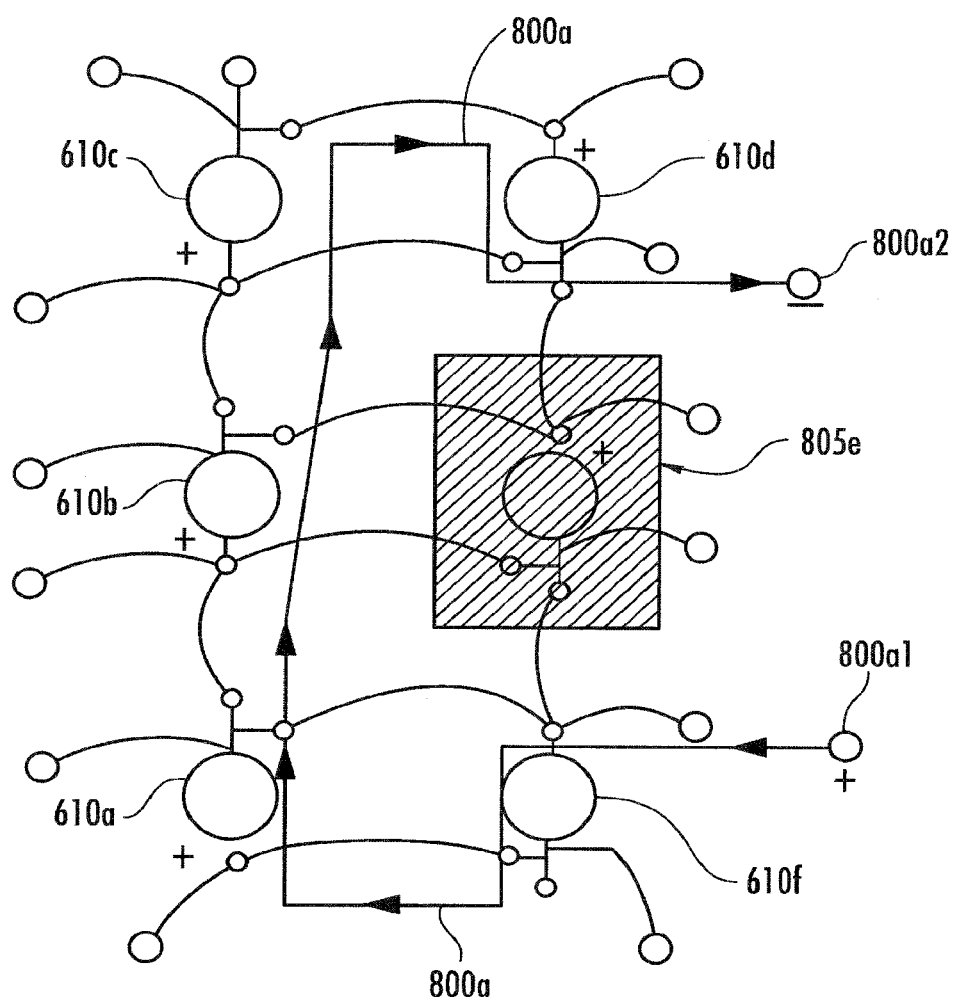
FIGS. 8A-8C depict various connection systems for by-passing underperforming solar cells in accordance with the present teachings.
Figure 8B:
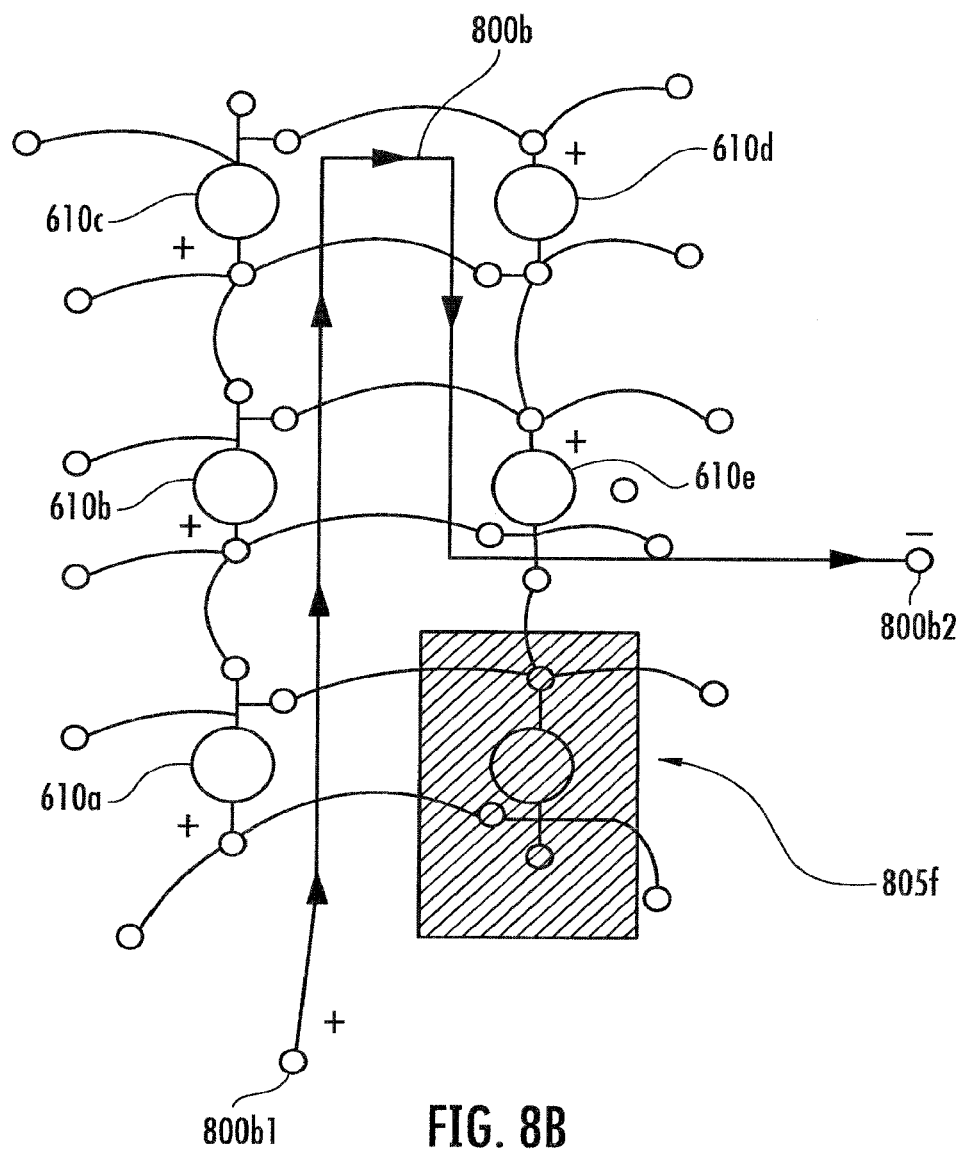
Figure 8C:
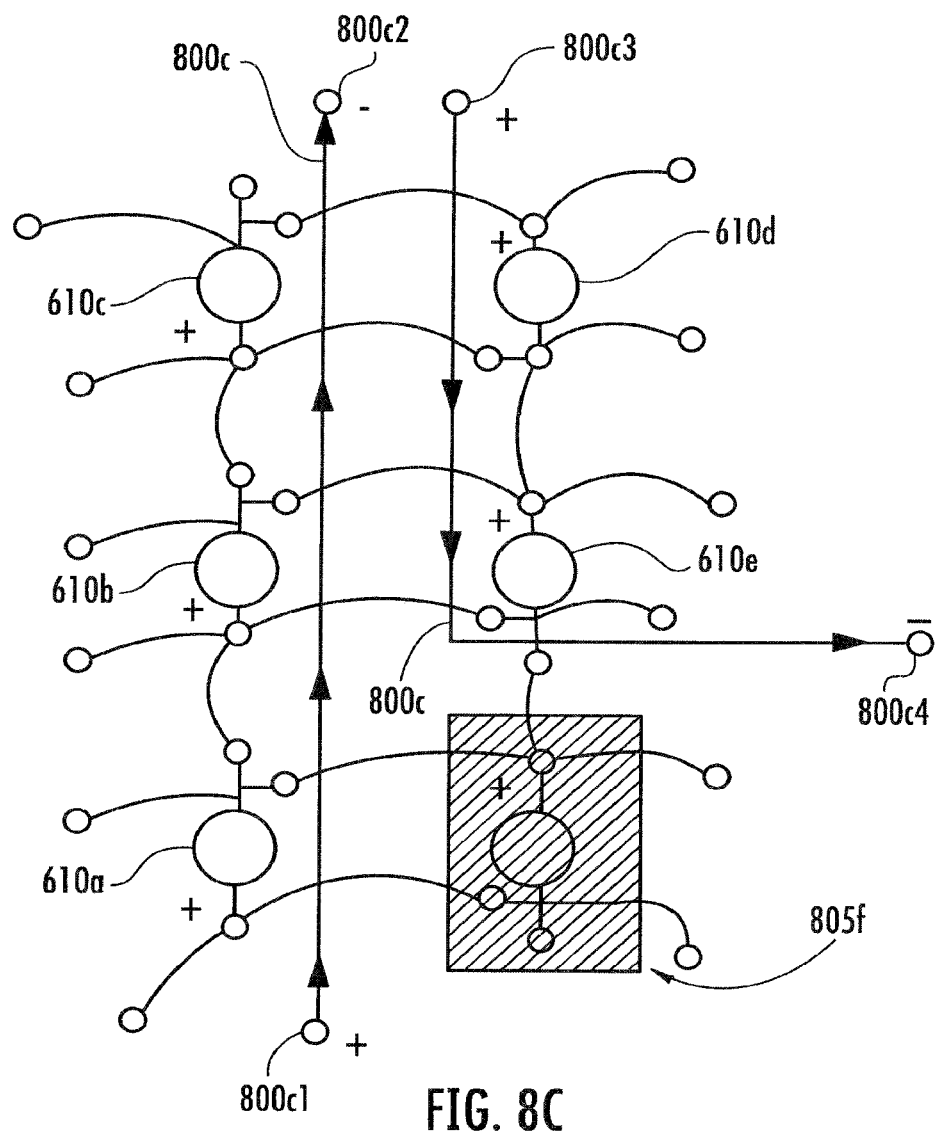

Still using the super connection system 600A as an example, FIGS. 8A-8C show various by-passing connection systems in accordance with the present teachings. It should be readily apparent to one of ordinary skill in the art that the systems depicted in FIGS. 8A-8C represent generalized schematic illustrations and that other components/devices can be added or existing components/devices can be removed or modified.

In various embodiments, underperforming solar cell(s) of a plurality of solar cell elements can first be disconnected, e.g., by turning off associated switches, while other solar cell elements of the plurality of solar cell elements can remain connected or can be reconnected or rearranged to provide a second suitable super connection. In various embodiments, the rearranged other solar cell elements can include one or more loops of solar cell series according to a power output.

In one exemplary embodiment shown in FIG. 8A, when one solar cell device 805e underperforms, the solar cell device 805e, including the related solar cell element (also see the solar cell element 610e of FIG. 6A) and/or its related switches, can be disconnected, e.g., by turning off all associated switches, from the plurality of solar cell devices. Remaining solar cell devices (see 610a-d and 610f) can then be re-arranged or re-super connected, e.g., connected in series (see 800a), whereby providing connection contacts of 800a1 and 800a2.

Likewise, in another exemplary embodiment shown in FIG. 8B, when another solar cell device 805f (also see the solar cell element 610f of FIG. 6A) underperforms and is disconnected from the plurality of solar cell devices, the other remaining solar cell devices (see 610a-e) can be re-arranged or re-super connected in one series (see 800b), whereby providing connection contacts of 800b1 and 800b2.

In an additional exemplary embodiment shown in FIG. 8C, when the solar cell device 805f underperforms and is disconnected, the other remaining solar cell devices (see 610a-e) can be re-arranged or re-super connected to have two loops 800c of connected solar cell series (see 600a-c and 600d-e) providing connection contacts of 800c1, 800c2, 800c3 and 800c4.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operation of a solar cell element, comprising:
   monitoring an electrical output of a solar cell area in the solar cell element, wherein the solar cell element comprising a p-type semiconductor terminal and an n-type semiconductor terminal;
   determining if the electrical output is less than a predetermined value; and
   bypassing the solar cell area in the solar cell element if the electrical output is less than the predetermined value, wherein the bypassing comprises controlling a source region or a drain region of a semiconductor switch, wherein the drain region is an n-type semiconductor region formed within a p-type semiconductor substrate of the solar cell element; wherein the n-type semiconductor terminal of the solar cell element being formed within the drain region of the semiconductor switch.

2. The method of claim 1, wherein the bypassing comprises bypassing the electrical output of the solar cell area in the solar cell element.

3. The method of claim 1, wherein the monitoring comprises reading the electrical output of the solar cell area in the solar cell element.

4. The method of claim 1, wherein the monitoring comprises reading an electrical signal output across the p-type semiconductor terminal and the n-type semiconductor terminal of the solar cell element.

5. A method of operation of a solar cell element, comprising:
  monitoring an electrical signal output from a solar cell area in a solar cell element, wherein the solar cell element including a p-n junction, a p-type semiconductor terminal and an n-type semiconductor terminal;
  determining if the electrical signal output from the solar cell area is less than a value; and
  controlling a switch component integrated together with the solar cell element to bypass the solar cell area if the electrical signal output from the solar cell area is less than the value, wherein the switch component comprises a source region and a drain region integrated together with the solar cell element, wherein the drain region is an n-type doped region of the p-n junction of the solar cell element, wherein the drain region is formed within a p-doped region of the p-n junction, and the n-type semiconductor terminal of the solar cell element is formed within the drain region of the switch component.

6. The method of claim 5, wherein the monitoring comprises measuring the electrical signal output across the p-type semiconductor terminal and the n-type semiconductor terminal of the solar cell element.

7. The method of claim 5, wherein the controlling comprises controlling the source region or the drain region of the switch component, wherein the switch component is a laterally diffused metal oxide semiconductor (LDMOS) transistor or a vertically diffused metal oxide semiconductor (VDMOS) transistor.

8. The method of claim 5, wherein the solar cell element further comprises an external contact for connecting the solar cell element with an external circuitry.

* * * * *